US011355407B2

(12) United States Patent
Liao et al.

(10) Patent No.: US 11,355,407 B2
(45) Date of Patent: Jun. 7, 2022

(54) MICRO HEATER CHIP, WAFER-LEVEL ELECTRONIC CHIP ASSEMBLY AND CHIP ASSEMBLY STACKING SYSTEM

(71) Applicant: Skiileux Electricity Inc., Taoyuan (TW)

(72) Inventors: Chien-Shou Liao, New Taipei (TW); Te-Fu Chang, Taichung (TW)

(73) Assignee: Skiileux Electricity Inc., Taoyuan (TW)

( * ) Notice: Subject to any disclaimer, the term of this patent is extended or adjusted under 35 U.S.C. 154(b) by 164 days.

(21) Appl. No.: 16/997,191

(22) Filed: Aug. 19, 2020

(65) Prior Publication Data

US 2021/0183720 A1 Jun. 17, 2021

(30) Foreign Application Priority Data

Dec. 17, 2019 (TW) .................................. 108146081

(51) Int. Cl.
| | | |
|---|---|---|
| *H01L 21/00* | (2006.01) | |
| *H01L 23/34* | (2006.01) | |
| *H01L 25/065* | (2006.01) | |
| *H01L 21/683* | (2006.01) | |

(52) U.S. Cl.
CPC ........ *H01L 23/345* (2013.01); *H01L 21/6835* (2013.01); *H01L 25/0657* (2013.01); *H01L 2225/06513* (2013.01); *H01L 2225/06562* (2013.01)

(58) Field of Classification Search
CPC H01L 23/345; H01L 21/6835; H01L 25/0657
See application file for complete search history.

(56) References Cited

U.S. PATENT DOCUMENTS

| | | | | |
|---|---|---|---|---|
| 8,587,134 | B2* | 11/2013 | Im | H01L 24/73 |
| | | | | 257/746 |
| 11,222,829 | B2* | 1/2022 | Liao | H01L 23/345 |
| 11,222,833 | B2* | 1/2022 | Liao | H01L 24/17 |

(Continued)

FOREIGN PATENT DOCUMENTS

| | | | | | |
|---|---|---|---|---|---|
| CN | 112992812 A | * | 6/2021 | ......... | H01L 21/6835 |
| CN | 113948628 A | * | 1/2022 | ....... | H01L 21/67098 |
| WO | WO-2017052653 A1 | * | 3/2017 | ......... | H01L 21/6835 |

*Primary Examiner* — Laura M Menz

(74) *Attorney, Agent, or Firm* — JCIPRNET

(57) ABSTRACT

A micro heater chip, a wafer-level electronic chip assembly and a chip assembly stacking system are provided. The chip assembly stacking system includes a plurality of wafer-level electronic chip assemblies stacked on top of one another and electrically connected with each other. Each wafer-level electronic chip assembly includes a wafer-level electronic chip and a micro heater chip disposed on the wafer-level electronic chip. The micro heater chip includes a heating structure and an insulative structure disposed between the heating structure and the wafer-level electronic chip. The heating structure includes a carrier body, at least one micro heater disposed on or inside the carrier body, and a plurality of conductive connection layers passing through the carrier body. The insulative structure includes an insulative body disposed between the heating structure and the wafer-level electronic chip, and a plurality of conductive material layers passing through the insulative body.

10 Claims, 8 Drawing Sheets

(56) References Cited

U.S. PATENT DOCUMENTS

| | | | |
|---|---|---|---|
| 2013/0134606 A1* | 5/2013 | Im | H01L 24/32 257/734 |
| 2020/0340312 A1* | 10/2020 | Ross | E21B 21/066 |
| 2021/0043552 A1* | 2/2021 | Liao | H01L 23/49816 |
| 2021/0134695 A1* | 5/2021 | Liao | H05B 3/26 |
| 2021/0183720 A1* | 6/2021 | Liao | H01L 21/6835 |
| 2021/0320225 A1* | 10/2021 | Liao | H01L 25/0753 |
| 2022/0020619 A1* | 1/2022 | Liao | H01L 21/67132 |
| 2022/0020723 A1* | 1/2022 | Liao | H01L 23/345 |
| 2022/0093557 A1* | 3/2022 | Liao | H01L 21/6835 |

* cited by examiner

MICRO HEATER CHIP, WAFER-LEVEL ELECTRONIC CHIP ASSEMBLY AND CHIP ASSEMBLY STACKING SYSTEM

CROSS-REFERENCE TO RELATED PATENT APPLICATION

This application claims the benefit of priority to Taiwan Patent Application No. 108146081, filed on Dec. 17, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a micro heater chip, a wafer-level electronic chip assembly and a chip assembly stacking system, and more particularly to a micro heater chip with at least one micro heater, a wafer-level electronic chip assembly with at least one micro heater, and a chip assembly stacking system with at least one micro heater.

BACKGROUND OF THE DISCLOSURE

Currently, an IC chip can be electrically connected to a PCB by heating solder balls, but the conventional method for heating the solder balls still has room for improvement.

SUMMARY OF THE DISCLOSURE

In response to the above-referenced technical inadequacies, the present disclosure provides a micro heater chip, a wafer-level electronic chip assembly and a chip assembly stacking system.

In one aspect, the present disclosure provides a micro heater chip applied to a wafer-level electronic chip, including a temporary carrier substrate, a heating structure disposed on the temporary carrier substrate, and an insulative structure disposed on the heating structure. The heating structure includes a carrier body disposed on the temporary carrier substrate, at least one micro heater disposed on or inside the carrier body, and a plurality of conductive connection layers passing through the carrier body. The insulative structure includes an insulative body disposed on the heating structure and a plurality of conductive material layers passing through the insulative body, and the conductive material layers are respectively electrically connected to the conductive connection layers.

In another aspect, the present disclosure provides a wafer-level electronic chip assembly, including a wafer-level electronic chip and a micro heater chip disposed on the wafer-level electronic chip. The micro heater chip includes a heating structure and an insulative structure disposed between the heating structure and the wafer-level electronic chip. The heating structure includes a carrier body, at least one micro heater disposed on or inside the carrier body, and a plurality of conductive connection layers passing through the carrier body. The insulative structure includes an insulative body disposed between the heating structure and the wafer-level electronic chip, and a plurality of conductive material layers passing through the insulative body, and the conductive material layers are respectively electrically connected to the conductive connection layers.

In yet another aspect, the present disclosure provides a chip assembly stacking system including a plurality of wafer-level electronic chip assemblies stacked on top of one another and electrically connected with each other, and each of the wafer-level electronic chip assemblies includes a wafer-level electronic chip and a micro heater chip disposed on the wafer-level electronic chip. The micro heater chip includes a heating structure and an insulative structure disposed between the heating structure and the wafer-level electronic chip. The heating structure includes a carrier body, at least one micro heater disposed on or inside the carrier body, and a plurality of conductive connection layers passing through the carrier body. The insulative structure includes an insulative body disposed between the heating structure and the wafer-level electronic chip, and a plurality of conductive material layers passing through the insulative body, and the conductive material layers are respectively electrically connected to the conductive connection layers.

In certain embodiments, the wafer-level electronic chip includes a circuit carrier, a circuit layout carried by the circuit carrier, and a plurality of conductive penetration layers passing through the circuit carrier, the circuit layout is electrically connected to the conductive penetration layers, and the wafer-level electronic chip includes a conductive top contact. The conductive material layer has a first end electrically connected to the conductive top contact of the wafer-level electronic chip, and the conductive material layer has a second end electrically contacting a first end of the conductive connection layer. The conductive connection layer has a second end exposed from the carrier body, and the second end of the conductive connection layer is electrically connected to a conductive bottom contact of the adjacent wafer-level electronic chip through a solder ball.

In certain embodiments, the heating structure includes an insulative protection layer for surrounding the at least one micro heater and the conductive connection layers, and the insulative protection layer is disposed between the insulative structure and the adjacent wafer-level electronic chip. The heating structure includes a power input contact electrically connected to the at least one micro heater, and the power input contact is exposed from the wafer-level electronic chip of the wafer-level electronic chip assembly. The wafer-level electronic chip assembly has a cutting surface formed on an outer lateral surface thereof.

In certain embodiments, the wafer-level electronic chip assemblies are sequentially stacked on a circuit substrate, and the bottommost wafer-level electronic chip assembly is electrically connected to the circuit substrate through a plurality of solder balls.

Therefore, by virtue of "the heating structure including a carrier body, at least one micro heater disposed on or inside the carrier body, and a plurality of conductive connection layers passing through the carrier body" and "the insulative structure including an insulative body disposed on the heating structure, and a plurality of conductive material layers passing through the insulative body, and the conductive material layers being respectively electrically connected to the conductive connection layers", the present disclosure can provide a micro heater chip with the at least one micro heater, a wafer-level electronic chip assembly with the at least one micro heater, and a chip assembly stacking system with the at least one micro heater.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
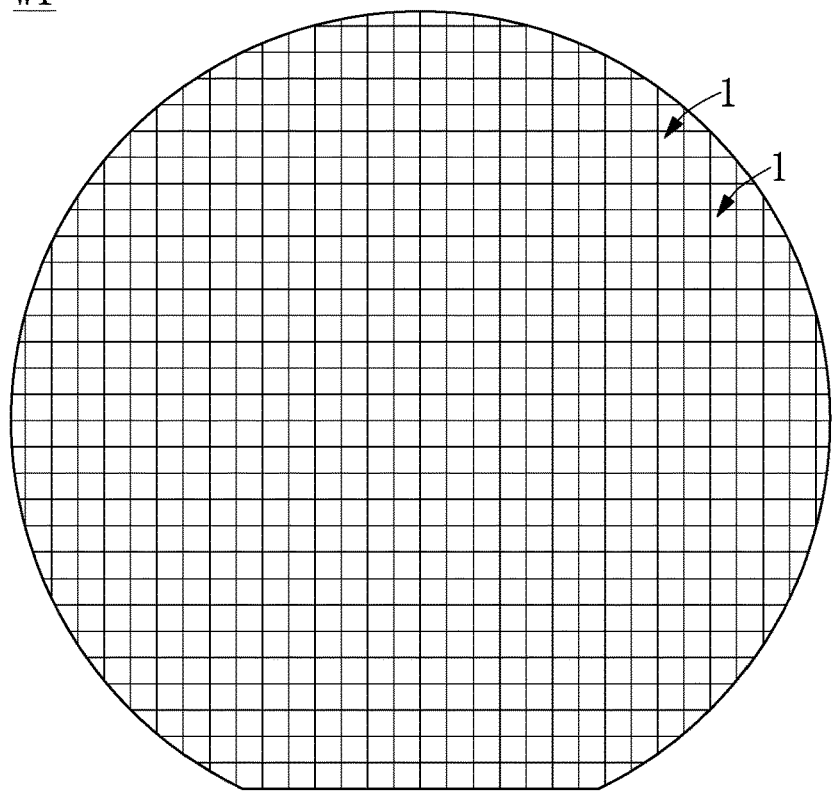
FIG. 1 is a schematic view of a first wafer according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
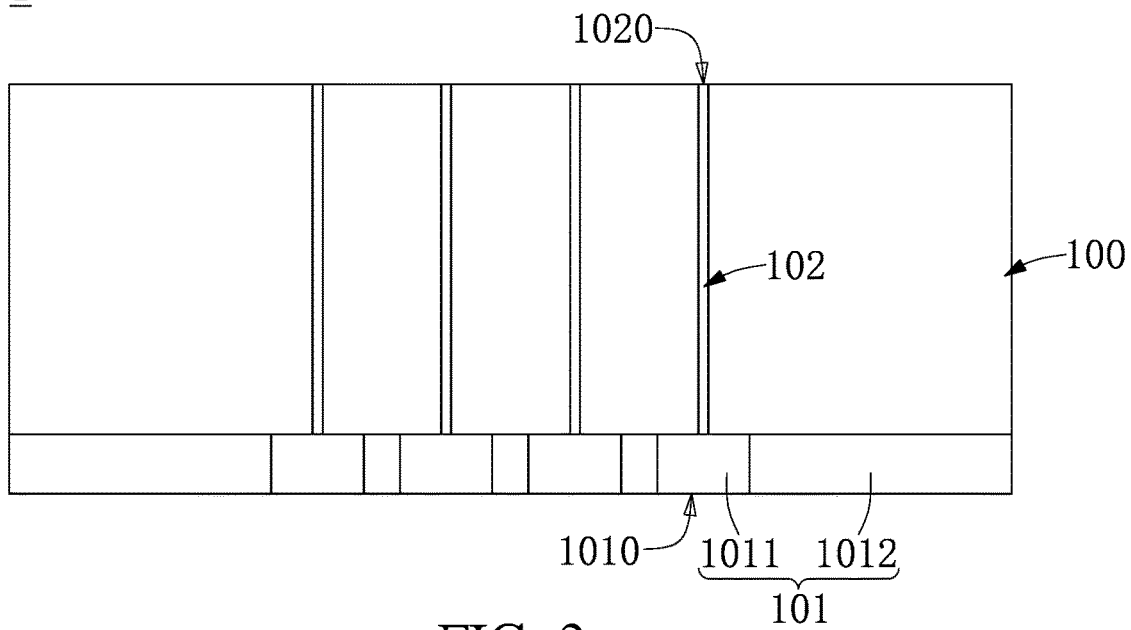
FIG. 2 is a schematic view of a wafer-level electronic chip according to the first embodiment of the present disclosure.

Referring to FIG. 1 and FIG. 2, a first embodiment of the present disclosure provides a first wafer W1 including a plurality of wafer-level electronic chips 1, and each wafer-level electronic chip 1 includes a circuit carrier 100, a circuit layout 101 carried by the circuit carrier 100, and a plurality of conductive penetration layers 102 (such as conductive through holes) passing through the circuit carrier 100. In addition, the circuit layout 101 can be electrically connected to the conductive penetration layers 102, and the wafer-level electronic chip 1 includes a conductive bottom contact 1010 and a conductive top contact 1020. For example, the circuit layout 101 may include a conductive circuit region 1011 electrically connected to the conductive penetration layers 102 and a non-circuit region 1012 insulated from the conductive penetration layers 102. However, the aforementioned description for the circuit layout 101 is merely an example and is not meant to limit the scope of the present disclosure.

Figure 3:
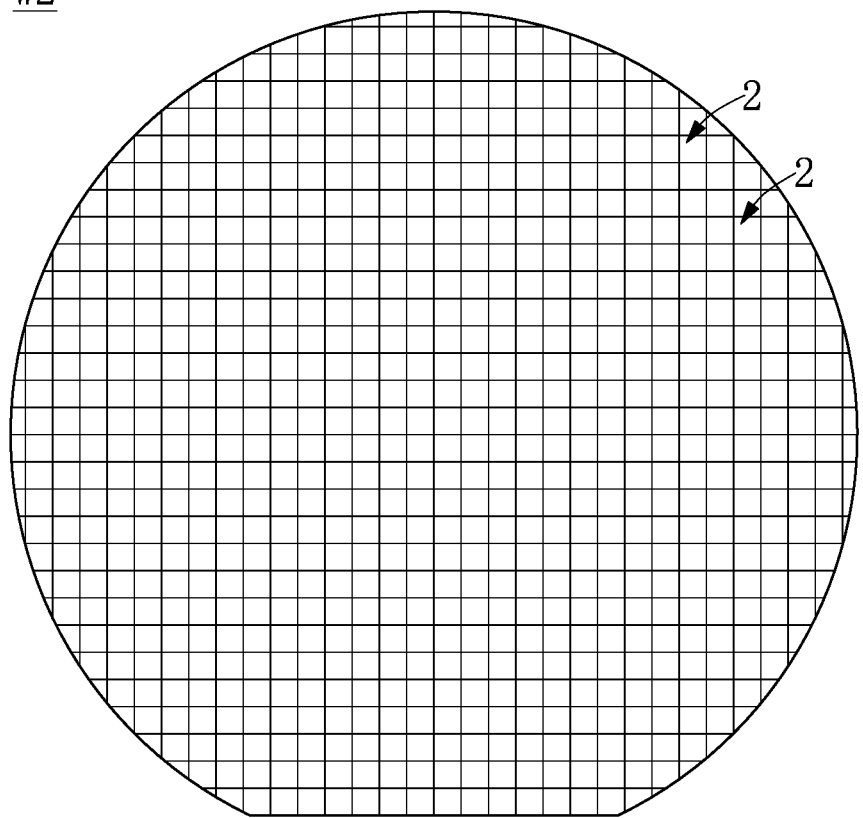
FIG. 3 is a schematic view of a second wafer according to the first embodiment of the present disclosure.
Figure 4:
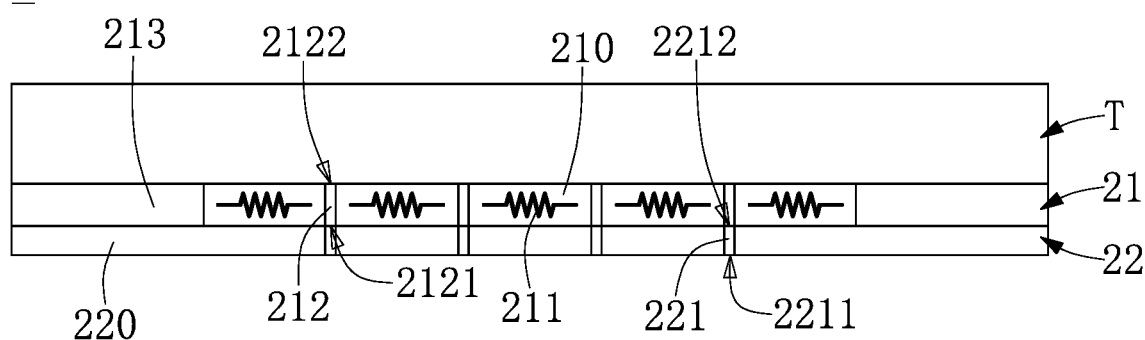
FIG. 4 is a schematic view of a micro heater chip according to the first embodiment of the present disclosure.

Referring to FIG. 3 and FIG. 4, the first embodiment of the present disclosure provides a second wafer W2 including a plurality of micro heater chips 2 applied to a wafer-level electronic chip 1, and each micro heater chip 2 includes a temporary carrier substrate T, a heating structure 21 and an insulative structure 22.

More particularly, as shown in FIG. 4, the heating structure 21 is temporarily disposed on the temporary carrier substrate T, and the insulative structure 22 is disposed on the heating structure 21. In addition, the heating structure 21 includes a carrier body 210 disposed on the temporary carrier substrate T, at least one micro heater 211 disposed on or inside the carrier body 210, and a plurality of conductive connection layers 212 passing through the carrier body 210, and the conductive connection layer 212 has a first end 2121 and a second end 2122. Moreover, the heating structure 21 further includes an insulative protection layer 213 for surrounding the at least one micro heater 211 and the conductive connection layers 212, and the insulative protection layer 213 is disposed between the temporary carrier substrate T and the insulative structure 22.

More particularly, as shown in FIG. 4, the insulative structure 22 includes an insulative body 220 disposed on the heating structure 21 and a plurality of conductive material layers 221 passing through the insulative body 220, and the conductive material layers 221 are respectively electrically connected to the conductive connection layers 212. In addition, the conductive material layer 221 has a first end 2211 exposed from the insulative body 220, and the conductive material layer 221 has a second end 2212 electrically contacting the first end 2121 of the conductive connection layer 212.

Second Embodiment

Figure 5:
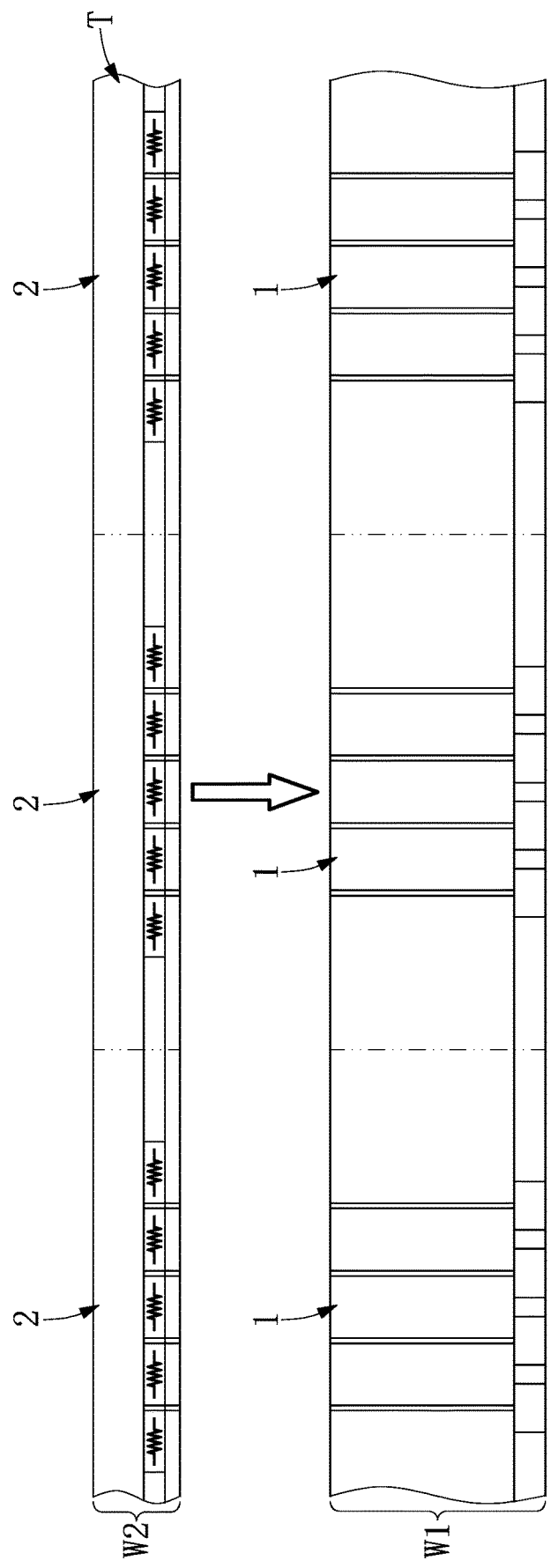
FIG. 5 shows a schematic view of a second wafer (including a plurality of micro heater chips) before being disposed on a first wafer (including a plurality of wafer-level electronic chips) according to a second embodiment of the present disclosure.
Figure 6:
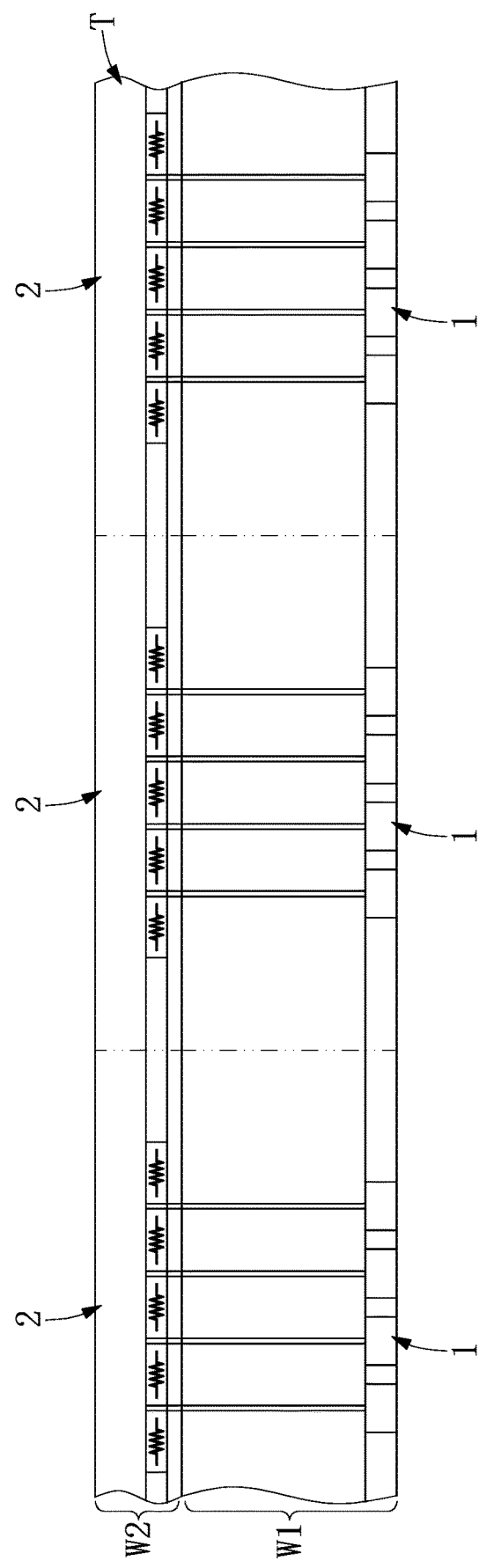
FIG. 6 shows a schematic view of the second wafer (including the micro heater chips) having been disposed on the first wafer (including the wafer-level electronic chips) according to the second embodiment of the present disclosure.
Figure 7:
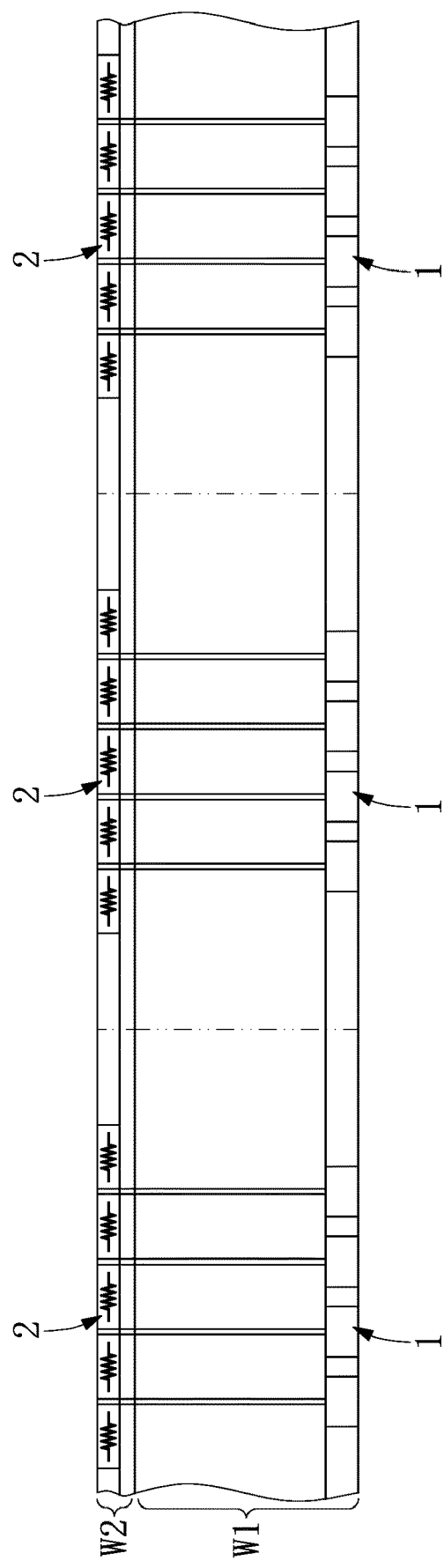
FIG. 7 shows a schematic view of a temporary carrier substrate having been moved from the second wafer according to the second embodiment of the present disclosure.
Figure 8:
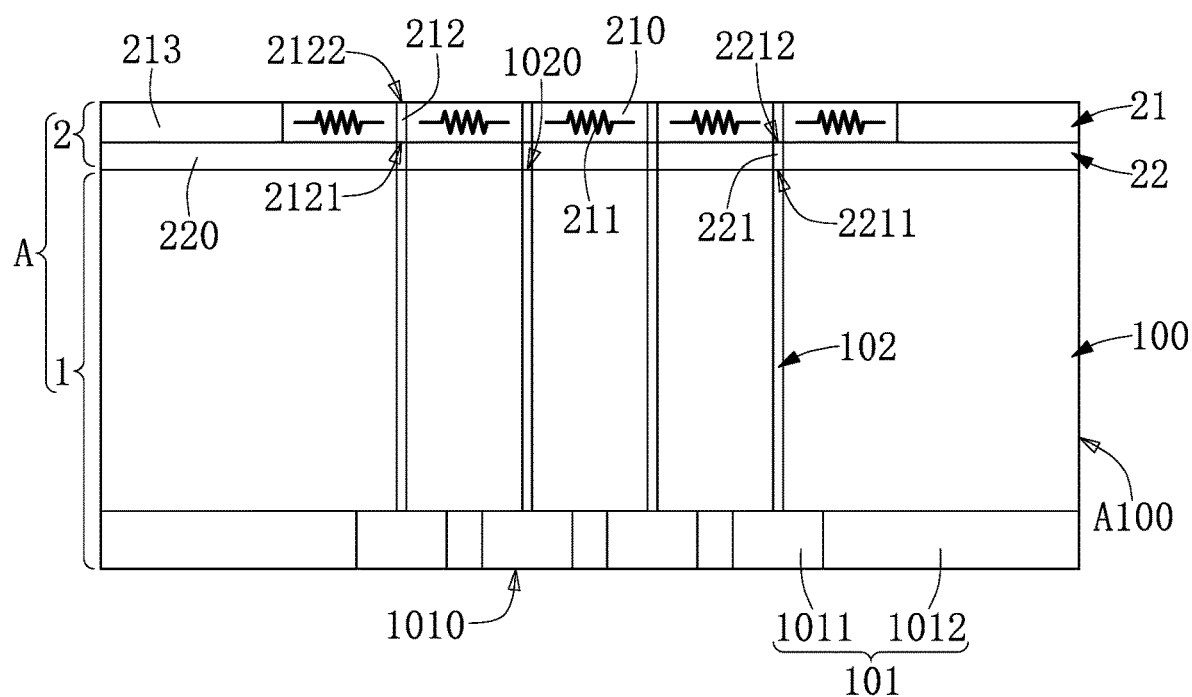
FIG. 8 shows a schematic view of a wafer-level electronic chip assembly according to the second embodiment of the present disclosure.

Referring to FIG. 5 to FIG. 8, in a second embodiment of the present disclosure, a second wafer W2 is disposed on a first wafer W1 in advance (as shown in FIG. 5 and FIG. 6), then a temporary carrier substrate T is removed from the second wafer W2 (as shown in FIG. 6 and FIG. 7), and afterwards the first wafer W1 and the second wafer W2 are cut along a cutting line (imaginary line) as shown in FIG. 7 so as to form a plurality of wafer-level electronic chip assemblies A (as shown in FIG. 8). Therefore, the second embodiment of the present disclosure can provide a wafer-level electronic chip assembly A, including a wafer-level electronic chip 1 and a micro heater chip 2 disposed on the wafer-level electronic chip 1, and the micro heater chip 2 includes a heating structure 21 and an insulative structure 22 disposed between the heating structure 21 and the wafer-level electronic chip 1.

More particularly, as shown FIG. 8, the heating structure 21 includes a carrier body 210, at least one micro heater 211 disposed on or inside the carrier body 210, and a plurality of conductive connection layers 212 passing through the carrier body 210. In addition, the insulative structure 22 includes an insulative body 220 disposed between the heating structure 21 and the wafer-level electronic chip 1, and a plurality of conductive material layers 221 passing through the insulative body 220, and the conductive material layers 221 are respectively electrically connected to the conductive connection layers 212. Moreover, the heating structure 21 includes an insulative protection layer 213 for surrounding the at least one micro heater 211 and the conductive connection layers 212, and the insulative protection layer 213 is disposed between the insulative structure 22 and another wafer-level electronic chip (not shown). It should be noted that the wafer-level electronic chip assembly A has a cutting surface A100 formed on an outer lateral surface thereof due to the cutting process of cutting the first wafer W1 and the second wafer W2 as shown in FIG. 7 and FIG. 8.

More particularly, as shown in FIG. 8, the wafer-level electronic chip 1 includes a circuit carrier 100, a circuit layout 101 carried by the circuit carrier 100, and a plurality of conductive penetration layers 102 passing through the circuit carrier 100. The circuit layout 101 is electrically connected to the conductive penetration layers 102, and the conductive penetration layer 102 of the wafer-level electronic chip 1 includes a conductive top contact 1020. In addition, the conductive material layer 221 has a first end 2211 electrically connected to the conductive top contact 1020 of the wafer-level electronic chip 1, and the conductive material layer 221 has a second end 2212 electrically contacting a first end 2121 of the conductive connection layer 212. Moreover, the conductive connection layer 212 has a second end 2122 exposed from the carrier body 210, and the second end 2122 of the conductive connection layer 212 is electrically connected to a conductive bottom contact (not shown) of another wafer-level electronic chip (not shown) through a solder ball (not shown). It should be noted that when the temporary carrier substrate T is removed from the second wafer W2 (as shown in FIG. 7 and FIG. 8), the second end 2122 of the conductive connection layer 212 is exposed from the carrier body 210.

Third Embodiment

Figure 9:
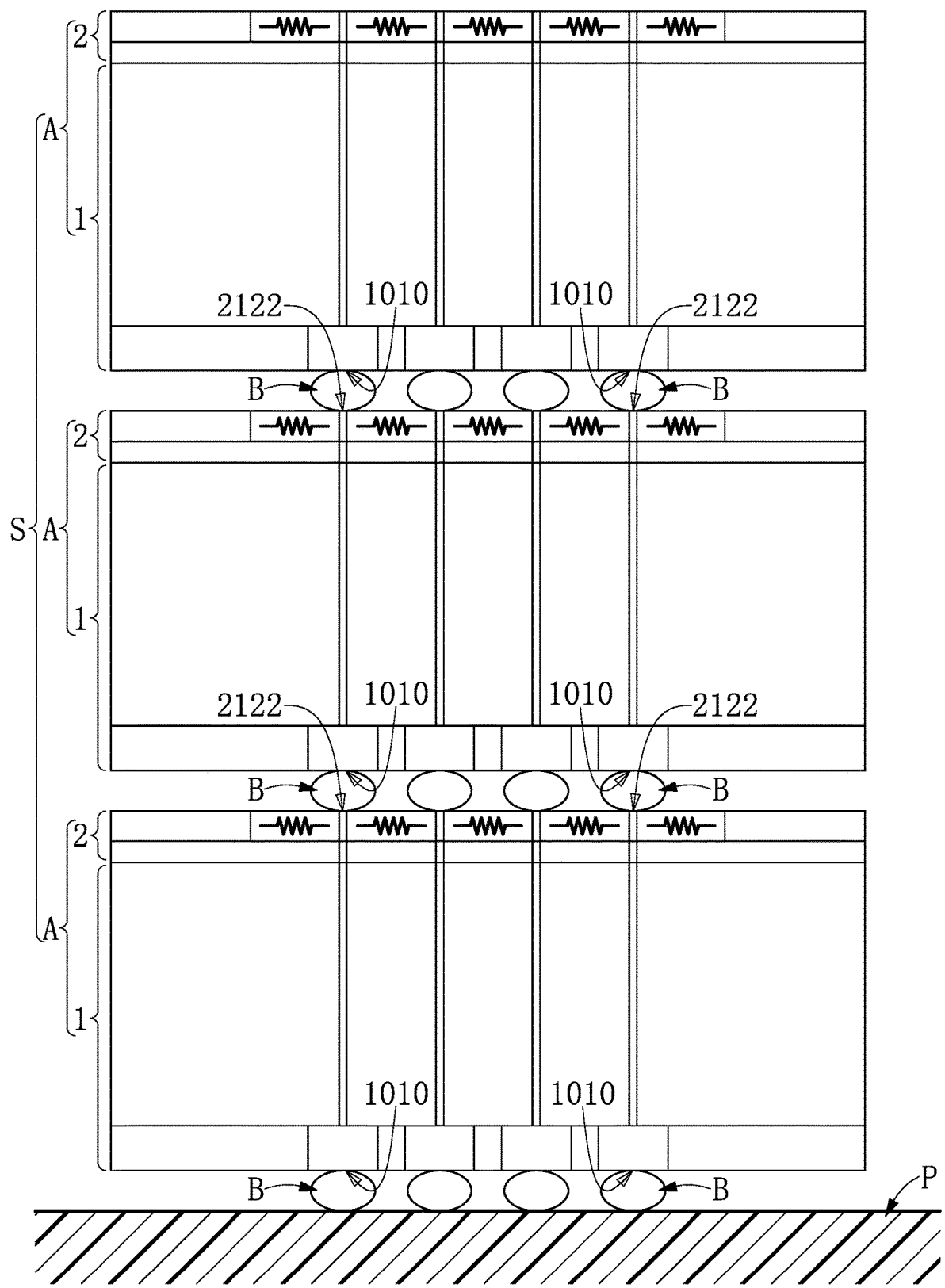
FIG. 9 shows a schematic view of a chip assembly stacking system according to a third embodiment of the present disclosure.

Referring to FIG. 8 and FIG. 9, a third embodiment of the present disclosure provides a chip assembly stacking system S including a plurality of wafer-level electronic chip assemblies A stacked on top of one another and electrically connected with each other. Each of the wafer-level electronic chip assemblies A includes a wafer-level electronic chip 1 and a micro heater chip 2 disposed on the wafer-level electronic chip 1, and the micro heater chip 2 includes a heating structure 21 and an insulative structure 22 disposed between the heating structure 21 and the wafer-level electronic chip 1. In addition, the wafer-level electronic chip assemblies A can be sequentially stacked on a circuit substrate P, and the bottommost wafer-level electronic chip assembly A can be electrically connected to the circuit substrate P through a plurality of solder balls B. Therefore, the solder balls B can be heated by driving the micro heater 211 so as to stackedly bond (or solder) the wafer-level electronic chip assemblies A on the circuit substrate P.

More particularly, as shown in FIG. 8, the heating structure 21 includes a carrier body 210, at least one micro heater 211 disposed on or inside the carrier body 210, and a plurality of conductive connection layers 212 passing through the carrier body 210. In addition, the insulative structure 22 includes an insulative body 220 disposed between the heating structure 21 and the wafer-level electronic chip 1, and a plurality of conductive material layers 221 passing through the insulative body 220, and the conductive material layers 221 are respectively electrically connected to the conductive connection layers 212. Moreover, the heating structure 21 includes an insulative protection layer 213 for surrounding the at least one micro heater 211 and the conductive connection layers 212, and the insulative protection layer 213 is disposed between the insulative structure 22 and the adjacent wafer-level electronic chip 1. It should be noted that the wafer-level electronic chip assembly A has a cutting surface A100 formed on an outer lateral surface thereof due to the cutting process of cutting the first wafer W1 and the second wafer W2 as shown in FIG. 7 and FIG. 8.

More particularly, as shown in FIG. 8, the wafer-level electronic chip 1 includes a circuit carrier 100, a circuit layout 101 carried by the circuit carrier 100, and a plurality of conductive penetration layers 102 passing through the circuit carrier 100, and the conductive penetration layer 102 of the wafer-level electronic chip 1 includes a conductive top contact 1020. In addition, the conductive material layer 221 has a first end 2211 electrically connected to the conductive top contact 1020 of the wafer-level electronic chip 1, and the conductive material layer 221 has a second end 2212 electrically contacting a first end 2121 of the conductive connection layer 212. Moreover, the conductive connection layer 212 has a second end 2122 exposed from the carrier body 210, and the second end 2122 of the conductive connection layer 212 is electrically connected to a conductive bottom contact 1010 of the adjacent wafer-level electronic chip 1 through a solder ball B.

Figure 10:
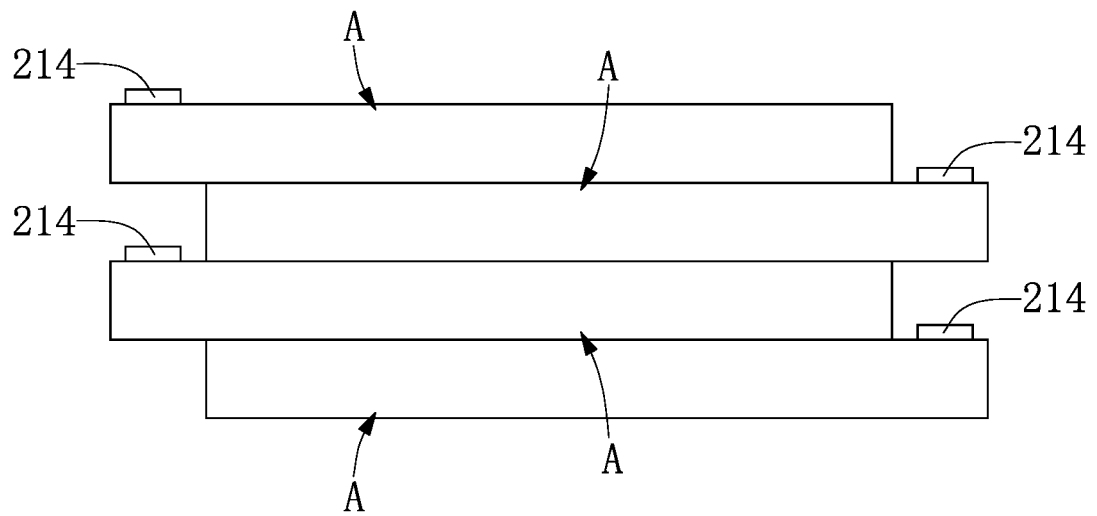
FIG. 10 shows a schematic view of another chip assembly stacking system according to the third embodiment of the present disclosure.
Figure 11:
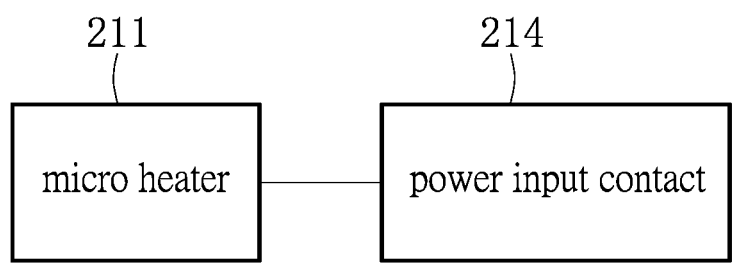
FIG. 11 is a functional block diagram of a micro heater electrically connected to a power input contact according to the third embodiment of the present disclosure.

It should be noted that the heating structure 21 includes a power input contact 214 electrically connected to the at least one micro heater 211 as shown in FIG. 8, FIG. 10 and FIG. 11. The wafer-level electronic chip assemblies A are staggered with respect to each other (in a staggered arrangement) and stacked on top of one another, so that the power input contact 214 is not covered (or shielded) by the wafer-level electronic chip 1 of the wafer-level electronic chip assembly A (that is to say, the power input contact 214 can be exposed from the wafer-level electronic chip 1 of the wafer-level electronic chip assembly A). Hence, it is convenient for a user to input power into the power input contacts 214 from the top side of each wafer-level electronic chip assembly A so as to turn on the micro heaters 211 to heat the solder balls B and then stackedly bond (or solder) the wafer-level electronic chip assemblies A on a PCB (not shown). For example, the power input contact 214 includes a positive contact and a negative contact, but it is merely an example and is not meant to limit the scope of the present disclosure.

In conclusion, by virtue of "the heating structure 21 including a carrier body 210, at least one micro heater 211 disposed on or inside the carrier body 210, and a plurality of conductive connection layers 212 passing through the carrier body 210" and "the insulative structure 22 including an insulative body 220 disposed on the heating structure 21, and a plurality of conductive material layers 221 passing through the insulative body 220, and the conductive material layers 221 being respectively electrically connected to the conductive connection layers 212", the present disclosure can provide a micro heater chip 2 with the at least one micro heater 211, a wafer-level electronic chip assembly A with the at least one micro heater 211, and a chip assembly stacking system S with the at least one micro heater 211.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A micro heater chip applied to a wafer-level electronic chip, comprising:
   a temporary carrier substrate;
   a heating structure disposed on the temporary carrier substrate; and
   an insulative structure disposed on the heating structure;
   wherein the heating structure includes a carrier body disposed on the temporary carrier substrate, at least one micro heater disposed on or inside the carrier body, and a plurality of conductive connection layers passing through the carrier body;
   wherein the insulative structure includes an insulative body disposed on the heating structure and a plurality of conductive material layers passing through the insulative body, and the conductive material layers are respectively electrically connected to the conductive connection layers.

2. The micro heater chip according to claim 1, wherein the conductive material layer has a first end exposed from the insulative body for electrically connecting to a conductive top contact of a first wafer-level electronic chip, and the conductive material layer has a second end electrically contacting a first end of the conductive connection layer; wherein after the temporary carrier substrate is removed from the micro heater chip, the conductive connection layer has a second end exposed from the carrier body, and the second end of the conductive connection layer is electrically connected to a conductive bottom contact of a second wafer-level electronic chip through a solder ball.

3. The micro heater chip according to claim 1, wherein the heating structure includes an insulative protection layer for surrounding the at least one micro heater and the conductive connection layers, the insulative protection layer is disposed between the temporary carrier substrate and the insulative structure, and the heating structure includes a power input contact electrically connected to the at least one micro heater.

4. A wafer-level electronic chip assembly, comprising a wafer-level electronic chip and a micro heater chip disposed on the wafer-level electronic chip, wherein the micro heater chip includes a heating structure and an insulative structure disposed between the heating structure and the wafer-level electronic chip;
   wherein the heating structure includes a carrier body, at least one micro heater disposed on or inside the carrier body, and a plurality of conductive connection layers passing through the carrier body;
   wherein the insulative structure includes an insulative body disposed between the heating structure and the wafer-level electronic chip, and a plurality of conductive material layers passing through the insulative body, and the conductive material layers are respectively electrically connected to the conductive connection layers.

5. The wafer-level electronic chip assembly according to claim 4, wherein the wafer-level electronic chip includes a circuit carrier, a circuit layout carried by the circuit carrier, and a plurality of conductive penetration layers passing through the circuit carrier, the circuit layout is electrically connected to the conductive penetration layers, and the wafer-level electronic chip includes a conductive top contact; wherein the conductive material layer has a first end electrically connected to the conductive top contact of the wafer-level electronic chip, and the conductive material layer has a second end electrically contacting a first end of the conductive connection layer; wherein the conductive connection layer has a second end exposed from the carrier body, and the second end of the conductive connection layer is electrically connected to a conductive bottom contact of another wafer-level electronic chip through a solder ball.

6. The wafer-level electronic chip assembly according to claim 5, wherein the heating structure includes an insulative protection layer for surrounding the at least one micro heater and the conductive connection layers, and the insulative protection layer is disposed between the insulative structure and the another wafer-level electronic chip; wherein the heating structure includes a power input contact electrically connected to the at least one micro heater, and the power input contact is exposed from the another wafer-level electronic chip; wherein the wafer-level electronic chip assembly has a cutting surface formed on an outer lateral surface thereof.

7. A chip assembly stacking system comprising a plurality of wafer-level electronic chip assemblies stacked on top of one another and electrically connected with each other, each of the wafer-level electronic chip assemblies includes a wafer-level electronic chip and a micro heater chip disposed on the wafer-level electronic chip, wherein the micro heater chip includes a heating structure and an insulative structure disposed between the heating structure and the wafer-level electronic chip;
   wherein the heating structure includes a carrier body, at least one micro heater disposed on or inside the carrier body, and a plurality of conductive connection layers passing through the carrier body;
   wherein the insulative structure includes an insulative body disposed between the heating structure and the wafer-level electronic chip, and a plurality of conductive material layers passing through the insulative body, and the conductive material layers are respectively electrically connected to the conductive connection layers.

8. The chip assembly stacking system according to claim 7, wherein the wafer-level electronic chip includes a circuit carrier, a circuit layout carried by the circuit carrier, and a plurality of conductive penetration layers passing through the circuit carrier, the circuit layout is electrically connected to the conductive penetration layers, and the wafer-level electronic chip includes a conductive top contact; wherein the conductive material layer has a first end electrically connected to the conductive top contact of the wafer-level electronic chip, and the conductive material layer has a second end electrically contacting a first end of the conductive connection layer; wherein the conductive connection layer has a second end exposed from the carrier body, and the second end of the conductive connection layer is electrically connected to a conductive bottom contact of the adjacent wafer-level electronic chip through a solder ball.

9. The chip assembly stacking system according to claim 8, wherein the heating structure includes an insulative protection layer for surrounding the at least one micro heater and the conductive connection layers, and the insulative protection layer is disposed between the insulative structure and the adjacent wafer-level electronic chip; wherein the heating structure includes a power input contact electrically connected to the at least one micro heater, and the power input contact is exposed from the wafer-level electronic chip of the wafer-level electronic chip assembly; wherein the wafer-level electronic chip assembly has a cutting surface formed on an outer lateral surface thereof.

10. The chip assembly stacking system according to claim 7, wherein the wafer-level electronic chip assemblies are sequentially stacked on a circuit substrate, and the bottommost wafer-level electronic chip assembly is electrically connected to the circuit substrate through a plurality of solder balls.

* * * * *